US009508944B2

(12) United States Patent
Matos et al.

(10) Patent No.: US 9,508,944 B2
(45) Date of Patent: Nov. 29, 2016

(54) COMPOSITE ORGANIC-INORGANIC ENERGY HARVESTING DEVICES AND METHODS

(71) Applicants: THE BOEING COMPANY, Chicago, IL (US); UNIVERSITY OF WASHINGTON CENTER FOR COMMERCIALIZATION, Seattle, WA (US)

(72) Inventors: Marvi A. Matos, Seattle, WA (US); Alpana N. Ranade, Bellevue, WA (US); Danilo C. Pozzo, Seattle, WA (US)

(73) Assignee: The Boeing Company, Chicago, IL (US)

( * ) Notice: Subject to any disclaimer, the term of this patent is extended or adjusted under 35 U.S.C. 154(b) by 349 days.

(21) Appl. No.: 13/828,708

(22) Filed: Mar. 14, 2013

(65) Prior Publication Data
US 2013/0269782 A1    Oct. 17, 2013

Related U.S. Application Data

(60) Provisional application No. 61/622,941, filed on Apr. 11, 2012, provisional application No. 61/623,017, filed on Apr. 11, 2012.

(51) Int. Cl.
*H01L 31/044*    (2014.01)
*H01L 51/42*    (2006.01)
(Continued)

(52) U.S. Cl.
CPC ....... *H01L 51/4213* (2013.01); *H01L 31/0384* (2013.01); *H01L 51/4233* (2013.01); *H01L 31/0376* (2013.01); *H01L 51/0036* (2013.01);
(Continued)

(58) Field of Classification Search
CPC ....... H01L 31/00–31/078; Y02E 10/50–10/60
USPC .................................. 136/243–265
See application file for complete search history.

(56) References Cited

U.S. PATENT DOCUMENTS

| 6,852,920 B2 | 2/2005 | Sager |
| 8,099,792 B1 | 1/2012 | Hersam |

(Continued)

FOREIGN PATENT DOCUMENTS

| BE | WO2010070101 | * | 6/2010 |
| DE | 10392855 T5 | | 9/2005 |

(Continued)

OTHER PUBLICATIONS

European Patent Office, PCT/US2013/035569 InternationalSearch Report and Written Opinion dated Jun. 18, 2013, pp. 1-12.

(Continued)

*Primary Examiner* — Bach Dinh
(74) *Attorney, Agent, or Firm* — Christopher J. Knors; Moore & Van Allen PLLC

(57) ABSTRACT

A hybrid organic-inorganic thin film is provided. The hybrid organic-inorganic thin film comprising: an organic-phase comprising a porous organic nanostructure comprised of an interpenetrating network having at least one dimension between 0.1 and 100 nm; and an inorganic phase at least partially distributed within the porosity of the organic phase. In a first aspect, the organic phase has a first band gap and the inorganic phase has a second band gap different from the first band gap. A method of producing an organic-inorganic energy harvesting device and a device therefrom comprising the hybrid organic-inorganic thin film is provided.

15 Claims, 4 Drawing Sheets

(51) Int. Cl.
*H01L 31/0384* (2006.01)
*H01L 31/0376* (2006.01)
*H01L 31/0256* (2006.01)
*H01L 51/00* (2006.01)

(52) U.S. Cl.
CPC .... *H01L 51/0037* (2013.01); *H01L 2031/0344* (2013.01); *Y02E 10/549* (2013.01); *Y02P 70/521* (2015.11)

(56) References Cited

U.S. PATENT DOCUMENTS

| | | | |
|---|---|---|---|
| 8,269,100 | B2 | 9/2012 | Darling |
| 2004/0084080 | A1* | 5/2004 | Sager ............... H01L 51/4226 136/263 |
| 2005/0257827 | A1 | 11/2005 | Gaudiana |
| 2005/0268962 | A1 | 12/2005 | Gaudiana |
| 2008/0041447 | A1* | 2/2008 | Tseng et al. ............... 136/263 |
| 2009/0188558 | A1 | 7/2009 | Jen |
| 2009/0229667 | A1 | 9/2009 | Shrotriya |
| 2009/0301550 | A1 | 12/2009 | Hunt |
| 2010/0078066 | A1 | 4/2010 | Darling |
| 2011/0168549 | A1 | 7/2011 | Roustaei |
| 2011/0253217 | A1 | 10/2011 | Grossman |
| 2012/0048368 | A1 | 3/2012 | Chaudhary |
| 2012/0273732 | A1 | 11/2012 | Jenekhe |

FOREIGN PATENT DOCUMENTS

| | | |
|---|---|---|
| WO | WO2009073862 A1 | 6/2009 |
| WO | WO2009114832 A2 | 9/2009 |
| WO | WO2010039634 A1 | 4/2010 |
| WO | WO2010049512 A1 | 5/2010 |
| WO | WO2010100345 A2 | 9/2010 |
| WO | WO2010102178 A2 | 9/2010 |
| WO | WO2011016839 A1 | 2/2011 |
| WO | WO2011045253 A1 | 4/2011 |
| WO | WO2011051292 A1 | 5/2011 |
| WO | WO2012031083 A2 | 3/2012 |
| WO | WO2012072271 A1 | 6/2012 |

OTHER PUBLICATIONS

Li, Gang: Rui, Zhu and Yang Yang, "Polymer solar cells," Nature Photonics Focus Review Artices, Feb. 29, 2012, pp. 153-161.
Krebs, F., (2009). Fabrication and processing of polymer solar cells: A review of printing and coating techniques. Solar Energy Materials and Solar Cells, pp. 394-412.
Barankin, M. D., Gonzalez II, E., Ladwig, A. M., & Hicks, R. F. (2007). Plasma-enhanced chemical vapor deposition of zinc oxide at atmospheric pressure and low temperature. Solar Energy Materials and Solar Cells , pp. 924-930.
Scopece, P., Viaro, A., Sulcis, R., Kulyk, I., Patelli. A., & Guglielmi, M.(2009). SiOx-based gas barrier coatings for polymer substrates by atmospheric pressure plasma jet deposition. Plasma Processes and Polymers , pp. S705-S710.
K. Lee et al: "Air-Stable Polymer Electronic Devices", Advanced Materials, vol. 19, No. 18, Aug. 9, 2007, pp. 2445-2449.
J. Richards, K. Weigandt and D.C. Pozzo (2011) Aqueous Dispersions of Colloidal Poly(3-hexylthiophene) Gel Particles with High Internal Porosity, J. Colloid and Interface Science, 364, 341.
Chang, K.-M., Huang, S.-H., Wu, C.-J., Lin, W.-L., Chen, W.-C., Chi, C.-W., Lin, J.-W., Chang, C.-C. (2011). Transparent conductive indium-doped zinc oxide films prepared by atmospheric pressure plasma jet. Thin Solid Films, pp. 5114-5117.
Dagkaldiran, Ü., Gordijn, A., Finger, F., Yates, H.M., Evans, P., Sheel, D.W., Remes, Z., Vanecek, M.(2009). Amorphous silicon solar cells made with SnO2:F TCO filmsdeposited by atmospheric pressure CVD. Materials Science and Engineering B, pp. 6-9.
Hu, J., Gordon, R.G. (1992). Textured aluminum-doped zinc oxide thin films from atmospheric pressure chemical vapor deposition. Journal of Applied Physics, pp. 880-890.
Ladwig, A. M., Koch, R. D., Wenski, E. G., & Hicks, R. F. (2009). Atmospheric plasma deposition of diamond-like carbon coatings. Diamond & Related Materials , pp. 1129-1133.
Sailer, R. A., Wagner, A., Schmit, C., Klaverkamp, M., & Schulz, D. L. (2008). Deposition of transparent conductive indium oxide by atmospheric-pressure plasma jet. Surface & Coatings Technology , pp. 835-858.
The International Bureau of WIPO, International Application No. PCT/US2013/035569, International Preliminary Report on Patentability dated Oct. 23, 2014, 8 pages.

* cited by examiner

COMPOSITE ORGANIC-INORGANIC ENERGY HARVESTING DEVICES AND METHODS

TECHNICAL FIELD

This disclosure relates to hybrid organic-inorganic energy harvesting devices based on an inverted manufacturing strategy comprising porous organic material with inorganic material deposited therein, methods of fabrication, and devices therefrom.

BACKGROUND

Strategies currently used to produce hybrid solar cell devices are limited, in part because they typically produce organic domains that are too large (typically >50 nm). This large size results in significant exciton decay before diffusion to p/n interface can occur. Despite currently having very low efficiency values, hybrid solar cells could prove to be one of the most disruptive technologies in the solar-module market because of (1) their very low production cost, (2) their potential for long-term stability and (3) their great potential for producing high efficiency multi-junction devices.

Typically, in the above methodology, a porous inorganic framework is synthesized using a variety of methods and it is subsequently filled, or at least partially filled, with suitable organic components. Unfortunately, inorganic frameworks cannot be produced with pores smaller than typical values for the exciton diffusion length (<10 nm). Furthermore, even if these small pore structures could be fabricated, diffusion and viscous limitations become increasingly severe and block the infiltration of the organic material.

The efficiency of previous hybrid cells has remained disappointingly low and improvements have been incremental and slow. This stark lack of progress originates from a fundamental flaw in the way hybrid devices are produced.

Some current approaches to generating hybrid photovoltaics include templated growth of zinc oxide (ZnO) nanowires and subsequent backfilling with poly(3-hexylthiophene) (P3HT). Devices based on this approach have limited applications because of the templating process and, moreover suffer from poor interfacial contact between materials with reported optimized power conversion efficiencies (PCE) of 2.7% or less. Another reported approach included the mixing of P3HT and ZnO nanoparticles in a single solution for coating from solution. While this approach is not limited by processability, it is limited by the random morphology of the photoactive layer that limits phase interconnectivity and, therefore, has resulted in reported optimized PCE of 2.0% or less.

SUMMARY

In a first embodiment, a method of producing an organic-inorganic energy harvesting device is provided. The method comprising introducing an organic layer to a conductive substrate, the organic layer comprising an interpenetrating network having at least one dimension between 0.1 and 100 nm; and introducing one or more semiconducting inorganic materials within the interpenetrating network. In an aspect of the embodiment, the organic layer has a first band gap and the one or more inorganic semiconducting materials have, independently, a second band gap different from the first band gap.

Alone or in combination with any one of the previous aspects, the organic layer comprises one or more conjugated polymers. The one or more conjugated polymers can comprise branching and/or roping.

Alone or in combination with any one of the previous aspects, the organic layer is introduced to the substrate by solvent casting, spin coating, blade coating or spraying. Alone or in combination with any one of the previous aspects, the organic layer is an organogel of one or more conjugated polymers.

Alone or in combination with any one of the previous aspects, the one or more semiconducting inorganic materials are introduced by deposition. Alone or in combination with any one of the previous aspects, the one or more semiconducting inorganic materials are introduced by plasma assisted deposition or chemical vapor deposition, atomic layer deposition, or magnetron sputtering. Alone or in combination with any one of the previous aspects, the one or more semiconducting inorganic materials are introduced directly to the interpenetrating network of fibers.

An energy harvesting device formed by any of the above aspects.

In a second embodiment, a hybrid organic-inorganic thin film is provided. The hybrid organic-inorganic thin film comprising: an organic-phase comprising a porous organic nanostructure comprised of an interpenetrating network having at least one dimension between 0.1 and 100 nm; and an inorganic phase at least partially distributed within the porosity of the organic phase. In a first aspect, the organic phase has a first band gap and the inorganic phase has a second band gap different from the first band gap.

Alone or in combination with any one of the previous aspects, the organic phase comprises one or more conjugated polymers, the one or more conjugated polymers comprises branching and/or roping. Alone or in combination with any one of the previous aspects, the organic layer is an organogel of one or more conjugated polymers.

Alone or in combination with any one of the previous aspects, the inorganic phase comprises one or more semiconducting inorganic materials. Alone or in combination with any one of the previous aspects, the one or more semiconducting inorganic materials are dispersed or distributed among the interpenetrating network of fibers.

In a third embodiment, a hybrid organic-inorganic energy harvesting device is provided. The hybrid organic-inorganic energy harvesting device comprising: a first electrode; an organic layer deposited on the first electrode, the organic layer comprising an interpenetrating network of one or more conjugated polymer fibers having at least one dimension between 0.1 and 100 nm to the substrate; and an inorganic semiconducting material at least partially distributed within the interpenetrating network of fibers; and a second electrode, wherein the organic layer and the inorganic semiconducting material are sandwiched between the first and the second electrodes. The organic layer can be an organogel of one or more conjugated polymers.

Alone or in combination with any one of the previous aspects, the organic layer is an organogel of the one or more conjugated polymers.

Alone or in combination with any one of the previous aspects, the organic phase in is an organogel of one or more conjugated polymers having a first band gap and the inorganic phase has a second band gap different from the first band gap. The device can be a solar cell.

DETAILED DESCRIPTION

Figure 1:
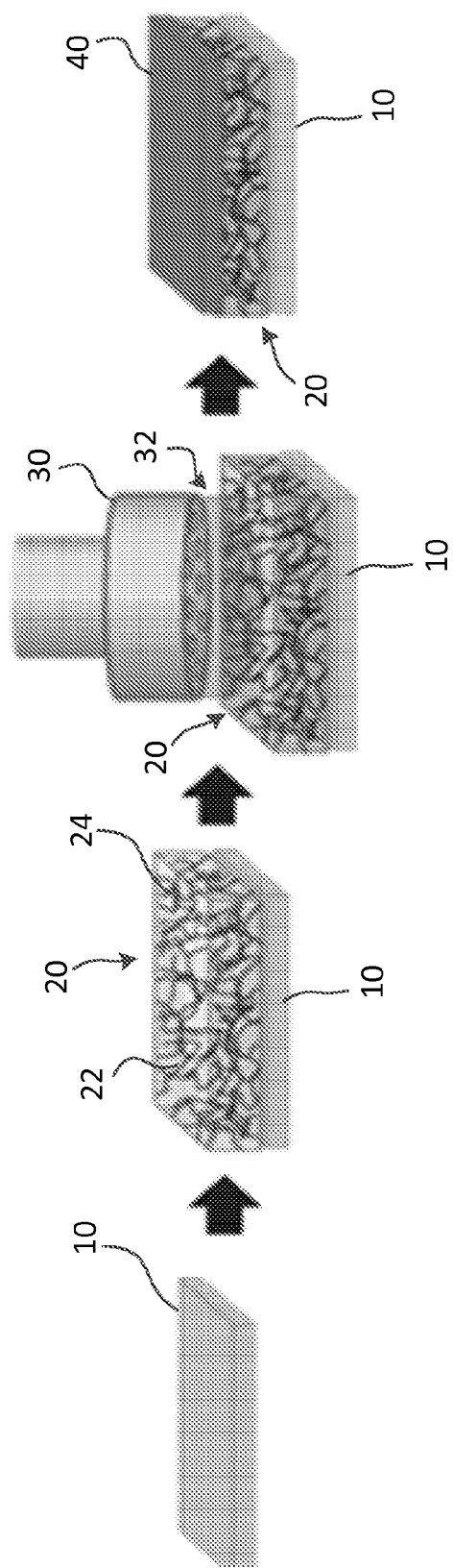
FIG. 1 depicts an exemplary method for producing hybrid solar cell devices by conformably coating an inorganic semiconductor phase around a self-assembled organic fiber network disclosed herein.

The present disclosure describes the formation of composite films that can be used for the manufacture of electronic devices (e.g. solar cells, transistors, or light emitting diodes). These composite films will comprise two interconnected phases of different materials. In one aspect, the composite film comprises an organic-inorganic interconnected phase. In one aspect, one phase is provided by solution or solvent-based methods and the other phase is provided by a deposition method. Combining solution and plasma methods allows the formation of p/n junctions with ideal properties (e.g., high interfacial area and charge connectivity). It also allows utilization of highly complex chemistries that are compatible with deposition but not with solvent deposition methods, and vise-versa.

Embodiments of the present disclosure will now be described more fully hereinafter with reference to the accompanying drawings, in which embodiments of the present disclosure are shown, which are embodied in many different forms and should not be construed as limited to the embodiments set forth herein. Rather, these embodiments are provided so that this disclosure will be thorough and complete, and will fully convey the scope of the claims to those skilled in the art. Like numbers refer to like elements throughout.

Definitions

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "deposited on" or "deposited onto" another element, it can be directly deposited on or deposited onto the other element or intervening elements may also be present. In contrast, when an element is referred to as being "directly deposited on" or "directly deposited onto" another element, there are no intervening elements present.

Relative terms such as "below" or "above" or "upper" or "lower" or "horizontal" or "vertical" or "top" or "bottom" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, steps, operations, elements, and/or components, but do not preclude the presence or addition of one or more other features, steps, operations, elements, components, and/or combinations thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

The term "organogel" is inclusive of any solid or semi-solid porous material, partially or substantially crystalline and/or amorphous, having an organic phase of self-assembled mono- or multilayers of structured molecules or polymers organized in such a way that they form a three-dimensional network structure or interpenetrating network structure of fibers, polymer fibers, individual molecules, polymer chains, or combinations thereof. Structured molecules or polymers include small molecule semiconductors and conjugated polymers. The pores of the three-dimensional network structure may or may contain a solvent or liquid material. The three-dimensional network of the organogel can be cross-linked. Cross-linking can be physical (e.g., entanglement) or chemical (covalent or ionic).

The phrase "interfacial area" as used herein is inclusive of a surface area of interconnection and/or contact between organic and inorganic materials or phases. The interfacial area includes surface area of interconnection and/or contact between inorganic material used to fill the interstitial space of the organic material. The interface includes, for example, the conjunction between the interstitial space of a conjugated polymer (e.g., polymer fibers) and the inorganic material present therein. The interfacial area is also inclusive of an area defining the two contacting phases. The total density of interfacial area present is between about 1 meter squared ($m^2$)/milliliter total composite film volume (grams/density) to about 200 $m^2$/milliliter of total composite film volume, which includes all organic and inorganic materials present in the interstitial space. A typical value for a dispersion of $TiO_2$ nanorods or particles is about 200 $m^2$/g, while an ordered (grown) nanotube/rod array can be about 1 m²/g depending on the surface density.

The term "porous" is used herein and is inclusive of a low bulk density material of solid or semi-solid material, partially or substantially crystalline and/or amorphous material having a plurality of voids. In one aspect, the voids have an average void diameter of approximately 100 nm but the pore size is approximately 10 nm to 10 μm. A porous organogel material e.g., comprising conjugated polymer, has a relatively high interfacial area when subjected to the solution/solvent deposition methods as disclosed herein in part due to concentrated samples, however, it is assumed that the void size is the same as the characteristic spacing between nanofibers or other void-like structure in the interpenetrating network.

The term "percolated" is inclusive of a porous organic material, organic polymer, conjugated organic polymer, and/or organogel in which domains are interconnected after processing, in accordance with the methods disclosed herein, so as to contain an inorganic material positioned and/or distributed within at least a portion of a void or void space of the porous organic material.

The terms "fiber" and "fibrillar" are used herein interchangeably.

The term "substantially" as used herein is inclusive of an amount greater than 80%, greater than 85%, greater than 90%, greater than 95%, up to 100%. For example, substantially crystalline is inclusive of an amount of crystallinity between 80% and 100%.

The term "about" as used herein is inclusive of +/−10%, +/−7%, +/−5%, +/−3%, +/−2% or +/−1% of the stated value unless otherwise indicated.

The phrase "conjugated polymer" as used herein is given its ordinary and customary meaning and is inclusive of polymer systems, and/or oligomeric systems, capable of conducting electric charge, with or without additional compounds, dopants, etc. While not conjugated polymers, per se, small-molecule dyes possessing semiconducting properties can also be used.

The inverted method disclosed and described herein provides hybrid active layers that most excitons generated within the organic phase of the dual phase organic-inorganic structure will diffuse to a p/n junction before recombination occurs and provide for the efficient separation and collection of charges.

Organic Materials and Polymers

Organogels of conjugated molecules, polymers or small-molecule dyes, formed through controlled self-assembly after deposition using solution-based coating methods are provided. The present approach is generally applicable to organic materials and polymers with tunable band-gaps and optical absorption spectra. In one aspect, conjugated polymers are employed. The organic material or polymers can be deposited on the substrate using a variety of methods such as screen printing, or spray, blade, or spin coating.

Exemplary conjugated polymers include:

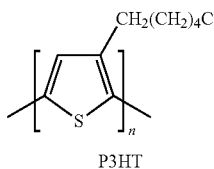

P3HT

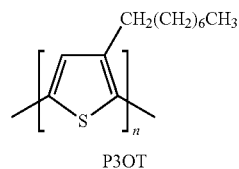

P3OT

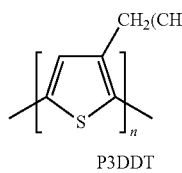

P3DDT

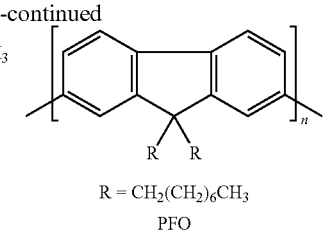

R = CH₂(CH₂)₆CH₃
PFO

Where P3HT is poly(3-hexylthiophene-2,5-diyl); P3OT is poly(3-octylthiophene-2,5-diyl); P3DDT is poly(3-dodecylthiophene-2,5-diyl); and PFO is poly(9,9-dioctyl fluorene. Other conjugated polymers and materials can be used in spirit and scope of the present disclosure. Other materials include acceptors and/or donors capable of adjusting HOMO and LUMO levels of the system, namely organic/inorganic interfaces.

In one aspect, the conjugated polymer is prepared such that a porous structure, which is inclusive of an interpenetrating fiber network, is provided. In one example, the conjugated organic polymer is dissolved in a solvent, cooled rapidly, and allowed to gel. In one aspect, the conjugated organic polymer dissolved in a solvent and cooled rapidly provides an organogel. In one aspect, the organogel comprises an interpenetrating network of conjugated polymer fibers. The interpenetrating network of conjugated polymer fibers can provide a defined fiber structure (organic phase organic domain). In one aspect, the fiber structure is formed from multiple polymer chains that are stacked together due to specific interactions between pi orbitals in a mechanism that is also known as "pi-pi" stacking. The inter-penetrating network of conjugated polymer fibers can comprise covalently or non-covalently coupled fibers. The covalently or non-covalently coupled fibers can be branched, linear, or combinations thereof, covalently or ionically cross-linked or substantially non-cross-linked.

Inorganic Materials

Exemplary inorganic materials include inorganic oxides, inorganic carbides, or inorganic nitrides, sulfides, for example, oxides/nitrides/sulfides/carbides of boron, titanium, zinc, iron, tungsten, vanadium, aluminum, niobium, oxides of silver, oxides of copper, oxides of tin, and mixtures thereof. In certain aspects, the inorganic materials are semiconductors. The oxides listed above include sub-oxides, stoichiometric oxides, and super-oxides, and includes, without limitation, one or more of $TiO_2$, $ZnO$, $Fe_2O_3$, $WO_3$, $SnO_2$, $Al_2O_3$, $V_2O_3$, $MoO_3$, $NiO$, $SrTiO_3$, as well as cesium carbonate $Cs(CO_3)$, aluminum nitride (AlN), and boron nitride (BN). The one or more of inorganic oxide, inorganic carbide, or inorganic nitrides can be used in a form that is suitable for deposition. The one or more of inorganic oxide, inorganic carbide, or inorganic nitrides can be of a size or form suitable for such applications, including powders, micron particles, submicron particles, nanoparticles, and physical mixtures and/or distributions thereof. Organometallic precursor compounds can be used alone or in combination with other reactants/precursors to introduce to the organic material, in-situ, and/or the formation of the inorganic material. Non-limiting examples of organometallic precursors include metal alkyls, metal hydrides, metal carboxylates, metal cyclopentadienyls, metal carbonyls, and combinations.

Deposition Techniques

The organic material discussed above can be deposited using conventional techniques, e.g., solvent casting, spin coating, blade coating, drop casting, screen printing, etc., which can be followed, as needed, by evaporative methods to remove substantially all of the solvent. Techniques to provide the porosity include conventional methods as well as those disclosed herein. Suitable substrates for the organic material, if used, include conductive substrates, metals, metal-coated polymer films, semiconducting thin films, e.g., ITO and the like. The substrate can be rigid or flexible.

The inorganic material can be coated conformably around the above porous organic framework, using one or more deposition processes, to provide a percolated thin film comprising a porous organic material with inorganic material deposited with the pores or voids of the organic material. In one aspect, a networked organic phase comprising suitably sized porous domains is produced via solution or solvent-based methods, e.g., of organogels, in combination with one or more deposition methods that subsequently forms pore-filling inorganic phases. The inorganic phase is at least partially positioned within the organic phase and provides at least a dual phase having interfacial contact between the phases. In one aspect the deposition process is chosen so as to minimize undesirable thermal effects to the organic phase, such as melting or other induced phase transitions, degradation, crosslinking, etc.

Exemplary examples of deposition processes for the inorganic materials that may be utilized in carrying out the methods herein disclosed include; simple vacuum evaporative deposition, low-temperature chemical vapor deposition (CVD); atomic layer deposition (ALD); corona discharge; dielectric barrier discharge; atmospheric pressure plasma jet; plasma enhanced chemical vapor deposition; atmospheric plasma glow discharge; atmospheric-pressure plasma liquid deposition; and magnetron sputtering. In one aspect, one or more of an evaporative deposition, a plasma or plasma-assisted deposition, chemical vapor deposition (CVD), metal organic chemical deposition (MOCVD), sputtering deposition, e.g., magnetron, is utilized to introduce, e.g., by depositing on or in, or depositing directly on or in, conformal inorganic material to porous regions of an organic material. Metals, metal oxides, metal carbides, metal sulfides, etc., can be deposited. In specific aspects of the embodiments herein disclosed, a deposition technology is utilized to deposit inorganic material on a conjugated polymer to provide an organic-inorganic energy harvesting device.

Energy Harvesting Devices

Hybrid energy harvesting devices can be produced with the present inverted method herein disclosed with low production costs, in part because they constitute a thin-film technology with low material requirements and because they use abundant raw materials (e.g., metal-oxides and organic compounds). Deposition methods are compatible with scalable manufacturing processes (e.g., roll-to-roll). Hybrid solar cells prepared by the methods disclosed herein take advantage of the highly tunable electronic structure of conjugated organic materials. This allows for the synthesis of the presently disclosed materials with variable optical band gaps that can absorb in different regions of the solar spectrum. Uses for presently disclosed thin film/deposition method include post-production application of photovoltaic coatings under atmospheric conditions.

Thus, in one embodiment, hybrid photovoltaic devices as disclosed herein comprise a p-type conjugated polymer or material and an n-type inorganic semiconductor, the p-type conjugated polymer or material and the n-type inorganic semiconductor having high interfacial contact area and vertical phase interconnectivity sandwiched between electrodes. The electrodes can independently be ITOs and/or metallic electrodes, graphene, and/or other conductive materials such as metal oxides, e.g., ZnO (doped or undoped), conductive ink/pastes, etc. In one aspect the organic phase comprises conjugated polymers and functions as a p-type semiconductor and the inorganic phase comprises semiconductor material that functions as an n-type semiconductor, the combined phases comprising a single layer or a plurality of layers. In one aspect, the organic material is percolated conjugated polymer. In another aspect, the organic material is a percolated conjugated polymer and the inorganic material is a semiconducting metal and/or metal oxide, nitride, sulfide, carbide, etc. Such arrangements of porous inorganic phases and conformal inorganic coatings provide an organic-inorganic hybrid composite material with high specific surface area and small organic domain sizes.

The use of the presently disclosed deposition process provides for an organic-inorganic hybrid energy harvesting thin-film. In one example, the organic-inorganic hybrid energy harvesting thin-film is positioned between conductive electrodes to provide an energy harvesting device. In one example the energy harvesting device is a photovoltaic device. The photovoltaic device can be a hybrid solar cell. In one aspect, hybrid photovoltaic devices are fabricated using a plasma enhanced deposition technology to deposit ZnO films as a conformal material on or directly on a solution processed, percolated P3HT layer.

Hybrid energy harvesting devices, e.g. solar cells, produced with the presently disclosed method can likely achieve efficiencies exceeding the Shockley-Queisser limit for single-junction devices (PCE greater than 33.7%). Hybrid solar cells prepared using the methods disclosed herein are likely to provide improved power conversion efficiencies (PCE) of about 2% to about 10%, to about 20%, to about 30% or more of the current maximum attainable values for hybrid solar cells prepared solely from organic materials or solely from metal-oxide materials, which have PCE values of less than 2%. In addition, unlike fully-organic solar cells, hybrid inorganic-organic solar cells prepared by the method herein disclosed are likely to have superior environmental stability, in part because their inorganic components impart superior mechanical strength, UV protection and improved resiliency to extreme temperatures. Long-term operational stability of solar modules is advantageous as well as module installation capability. Hybrid organic-inorganic solar cells as disclosed herein likely have, and are expected to provide, superior advantages in this area.

With reference to FIG. 1, an exemplary method is depicted to provide a hybrid organic-inorganic energy harvesting device. Thus, an interconnected network of nanometer sized organic interconnected fiber 20 (e.g., fibers 22 with high specific surface area) is solution deposited onto a bottom electrode 10, which may be a substrate, providing an organic phase 24. Inorganic material, preferably a semiconducting material 32, is then deposited on or directly on the organic phase 24 to backfill the percolated, interconnected networked fiber layer structure of organic phase 24. Deposition can be for example by plasma enhanced deposition techniques, atmospheric plasma techniques, etc. The organic-inorganic phases are sandwiched between top electrode 40. The presently disclosed method provides for increased and/or enhanced phase interconnectivity between the electrodes and high interfacial contact area between the organic and inorganic phases so as to maximize the PCE of the device.

Aerospace vehicles have a unique opportunity to harvest photovoltaic energy because they are often in direct contact with sunlight, which has an average power density of 1.2 kW/m². Smaller aircraft that are lightweight and require less fuel and could benefit from this direct source of power. Larger airliners may also benefit from solar energy harvesting for local power needs such as electro-chromic window assemblies or structural health monitoring systems (SHM) sensors. Low-cost alternative power sources will likely play a role in contributing to the total power load of future vehicles and systems. Energy harvesting thin-film methods and devices as disclosed herein are configurable for implementation on aerospace vehicles because said materials are lightweight and low-cost. In addition, energy harvesting thin-film methods and devices as disclosed herein allow conformal deposition onto parts with a variety of form factors while still remaining very thin (<1000 nm). The methods and devices disclosed herein provide for efficiency enhancement of hybrid photovoltaics and processing advantages that would allow for their direct application on future aircraft components.

In a first example, spin cast fibrillar poly(3-hexylthiophenes) and zinc oxide are provided. The morphology of both layers is independently configured for interconnectivity and high interfacial contact in order to maximize device efficiency. Examples of organogel thin films with different optical, structural and electrical properties were prepared and evaluated with various inorganic semiconductor materials deposited using vapor deposition techniques.

Regioregular poly(3-hexylthiophene) was purchased from Rieke metals and was reported to have a regioregularity, molecular weight and polydispersity index (PDI) of 93%, 41000 g/mol and 2.0, respectively. The P3HT was dissolved in toluene (purity >99.5%) at a high concentrations (>5 mg/mL) and at elevated temperatures (>80° C.) to form a completely dissolved polymer solution. Self-assembly and gelation was then induced through rapid cooling to approximately 5° C. in the refrigerator to percolated fiber networks.

Figure 2:
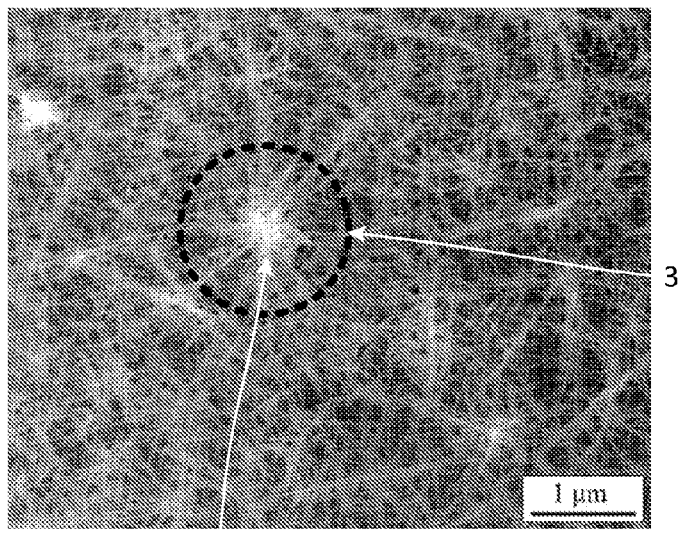
FIG. 2 depicts a Transmission Electron Micrograph (TEM) of a thin-film organic fiber network of poly-3-hexyl-thiophene (P3HT) coated from an organic solvent.
Figure 3:
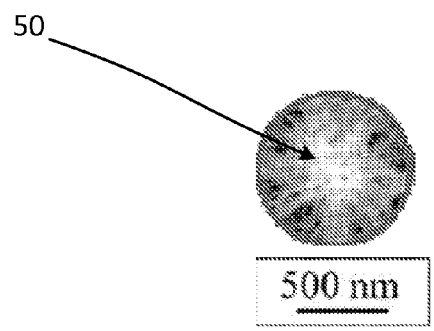
FIG. 3 depicts an enlarged section of FIG. 2 showing a nucleation center.
Figure 4:
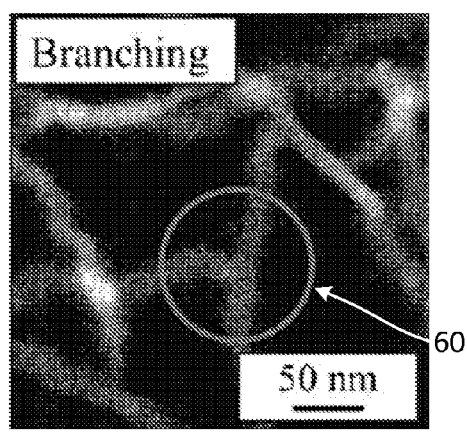
FIG. 4 an enlarged section of FIG. 2 showing a branching point.
Figure 5:
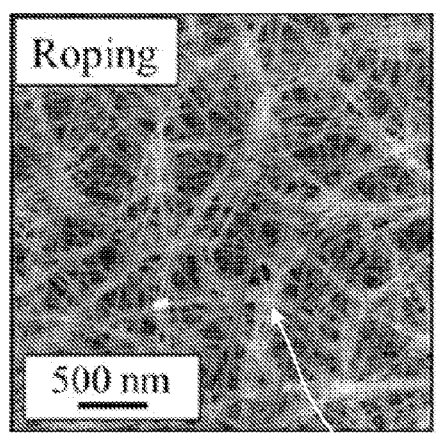
FIG. 5 depicts an enlarged section of FIG. 2 showing roping.

As shown in FIG. 2, fibrillar poly(3-hexylthiophene) networks of nano- or sub-micron to micron dimensions were generated at concentrations of 5, 10, 20 and 30 mg/mL and were deposited via spin-coating onto glass cover slips. FIG. 3 depicts a Transmission Electron Micrograph (TEM) of the thin-film organic fiber network of poly-3-hexyl-thiophene (P3HT), showing nucleation center 50, which is further depicted in exploded view FIG. 3. Additional morphology is demonstrated in enlarged sections depicted in FIGS. 4, 5, showing a branching point 60 and roping 70. The formation of interconnected fiber networks like the one shown in FIG. 2 is common to most conjugated organic materials due to their tendency to form pi-pi stacked fiber structures.

Concentration of the P3HT solution can be varied to provide a less porous network structure. Four spin speeds (1000, 1400, 1800 and 2200 RPM) and three deposition volumes (0.25 mL, 0.5 mL and 2×0.25 mL) were utilized to modify: the exciton bandwidth, which characterizes the degree of disorder within a crystalline P3HT fiber; the film conductivity, which characterizes how efficiently charges can be passed through the network structure; the fractional absorbance, which determines the maximum light that can be converted to current; and the film roughness, which describes the likelihood of pinhole defects.

Small angle x-ray scattering (SAXS) profiles for P3HT organogels formed in toluene and fibers present therein were found to be approximately 5 nm in thickness and 17 nm in width, which are ideal for exciton (bound electron-hole pairs) diffusion. As a result, the P3HT organogels are useful for p-type/n-type interface diffusion of excitons when used in hybrid photovoltaic devices. It is generally known that excitons have a maximum diffusion length of approximately 10 nm, which corresponds to the dimensions of the presently prepared P3HT fibers as within the ideal range for exciton diffusion. Furthermore, the P3HT fibers are not laterally aggregated in solution prior to film deposition and the P3HT fibers do not laterally aggregate during drying based on SAXS profiles for a P3HT fiber solution and a dried thin film generated from that same solution. As a result, small exciton diffusion distances and an overall increase in the potential p-type/n-type interfacial area is obtained.

Exciton bandwidth, which is a quantitative value for the crystalline ordering of P3HT fibers, was found to be constant regardless of P3HT solution concentration. Experiments demonstrated that the thin film conductivity (proportional to hole mobility) varies as a function of concentration for films prepared by the method. While not to be held by any particular theory, it is believed that while the electronic structure of the P3HT fibers is equivalent, the interconnectivity (e.g., network structure) of that particular sample is not. Higher concentration P3HT gels provide a more interconnected network structure due to the higher fiber density. A single absorbance value can be calculated when the wavelength-dependent thin film absorbance is weighted by the solar spectrum and summed across all visible wavelengths. Since light absorption is dominated by the thickness and/or concentration of the conjugated polymer in the presently disclosed P3HT/ZnO hybrid photovoltaic devices, this parameter is optimized.

High concentrations of conjugated polymer can lead to substantial increases in film roughness, which in certain aspects is an undesirable trait for photovoltaic devices because it can lead to pin-hole short circuits. It is observed that while concentration of the P3HT films has a substantial effect on the thin film structural, optical and electrical properties, solution processing of the P3HT films does not have a significant effect on these properties.

Substrates for coating, typically glass slides, were cleaned prior to deposition of the above P3HT utilizing the following sequential fifteen minute sonication steps: soapy water, DI water, acetone and ethanol. The substrates were then exposed to air plasma using a March Plasmod GCM-200 device operating at 150 W and 0.2 Torr for five minutes. For device preparation, substrates were coated with 1 mL of poly(3,4-ethylenedioxythiophene) poly(styrenesulfonate) PEDOT:PSS; Clevios 1000) at 1500 RPM for 1 minute and then baked at 150° C. for 5 minutes, then the P3HT organogel solution was spin coated on top of the PEDOT:PSS film at 1500 RPM for 1 minute. All solution coating steps were performed in air.

Zinc Oxide Inorganic Deposition

Figure 6:
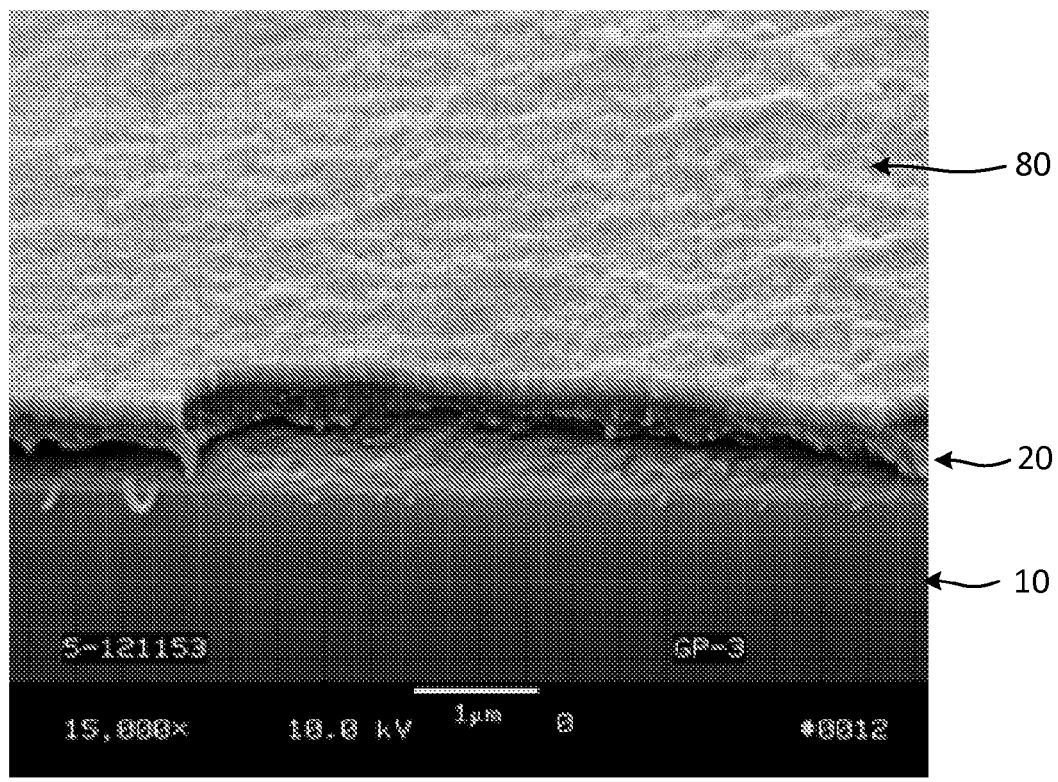
FIG. 6 is a Scanning Electron Microscope (SEM) of a multilayer coating of thin-film organic fiber network and semiconducting metal oxide on a substrate.

ZnO was magnetron sputtered on the above P3HT organogel thin film and properties of the resultant metal oxide-conjugated organic polymer composite film was evaluated. Zinc oxide was deposited using magnetron sputtering at a thickness of 50-250 nm under the following deposition conditions: pressure=10 mtorr, power=50 W and deposition rate=2 Å/s, DC bias=−108, argon flow=188 sccm and rotation=5. FIG. 6 depicts an SEM image of an exemplary sample having a 100 nm P3HT organogel film coated with 100 nm of ZnO via magnetron sputtering. FIG. 6 shows ZnO deposited directly on the porous P3HT network structure. The image indicates two distinct phases that are not likely completely interpenetrating, but nonetheless contain a substantial amount of bi-layer conformation within an interpenetrating region at the interface between the two layers. Modification of this bi-layer structure to maximize the phase interconnectivity of the high surface area of the fibers present in the organic phase optimizes overall device efficiency. Further optimization can be realized by maximizing crystallinity of the inorganic phase, for example.

Band energy alignment for hybrid photovoltaic devices based on a P3HT/ZnO photoactive layer was found to be significantly different than that reported in literature, likely, at least in part, due to the amorphous in nature of the inorganic oxide film. Low temperature deposition processes that avoid thermal degradation of the P3HT film, such as magnetron sputtering, typically provide amorphous films leading to a slight band gap mismatch and some energetic barriers to exciton dissociation that lower the overall device efficiency.

The degradation of a P3HT film after exposure to plasma was investigated. Thus, a P3HT organogel thin film was exposed to atmospheric plasma at a power 80 W for 2 minutes and at a distance of 5 mm. After this exposure, a 20% decrease in the electrical conductivity was measured, suggesting that the P3HT film may degrade in the presence of high energy plasma. On the other hand, a P3HT organogel and a P3HT organogel coated with zinc oxide using magnetron sputtering were found to have very similar optical properties, except at low wavelength where ZnO absorbs light, which suggests that the electronic band structure is not appreciably degrading with the magnetron sputtering deposition technique.

Strontium Titanate Inorganic Deposition Example

As discussed above, there are many organic and inorganic material combinations that can be utilized to provide the instant hybrid energy harvesting thin film devices in addition to the exemplary ZnO/P3HT-based device disclosed above. The purpose of this example was to evaluate the performance of a non-equal band structure pairing hybrid in organic-inorganic energy harvesting device. Strontium titanate has a wider band gap than ZnO and therefore the band mismatch will be greater. $SrTiO_3$ is known to crystallize at very high temperature (>450° C.) and therefore it is likely that this material is also deposited as an amorphous oxide. Thus, a P3HT/$SrTiO_3$-based device was prepared in a similar manner and in accordance with the methods disclosed herein. Strontium titanate was deposited on glass using magnetron sputtering at thickness of 50-250 nm under the following deposition conditions: pressure=$3.2 \times 10^{-7}$ torr, power=14% and deposition rate=2 Å/s, and the electronic band structure was characterized using a combination of UV-Vis spectroscopy and x-ray photoelectron spectroscopy (XPS).

Device Preparation

Hybrid thin film photovoltaics were generated using an inverted device geometry process comprising the structure of: ITO/PEDOT:PSS/P3HT/ZnO/Al. Thus, 1"×1" ITO coated glass is cleaned by sonication in soapy water, DI water, acetone and ethanol for 15 minutes each. The slides are then dried using lab air and placed in an air plasma (pressure=0.2 torr and power=150 W) for 5 minutes to increase the wetting of the next step. Clevios 1000; poly(3,4-ethylenedioxythiophene):poly(styrenesulfonate) (PEDOT:PSS) was utilized as a hole transport layer, which was filtered through a 450 µm filter prior to deposition. One milliliter of PEDOT:PSS solution was then spin-coated on top of the ITO with a "wetting" step of 650 RPM for 10 minutes followed by a "evaporation" step of 1500 RPM for 60 seconds. The PEDOT:PSS film was then annealed to remove trace water at 150° C. for 5 minutes. The P3HT/metal oxide active layer is then deposited as described above. An aluminum electrode is deposited using thermal evaporation with a shadow mask to define the device size (25 mm in diameter) and generate multiple devices (9×) per sample. Finally, conductive epoxy is utilized to create a bridge between the aluminum electrode and a metal wire for device testing.

Device Testing

Photovoltaic device properties of the samples prepared as described above were tested by connecting the ITO and aluminum electrodes to a Keithley 2400. Devices were held perpendicular to the incident light and at a pre-calibrated distance to generate a standard "1 sun" measurement. The "1 sun" condition was confirmed using a silicon solar cell standard. Voltage sweeps of 201 points over a −1 to 1 V range with a delay of 1 second per measurement were performed. Efficiency ($\eta$) and fill factor (FF) were calculated using literature methods.

Figure 7:
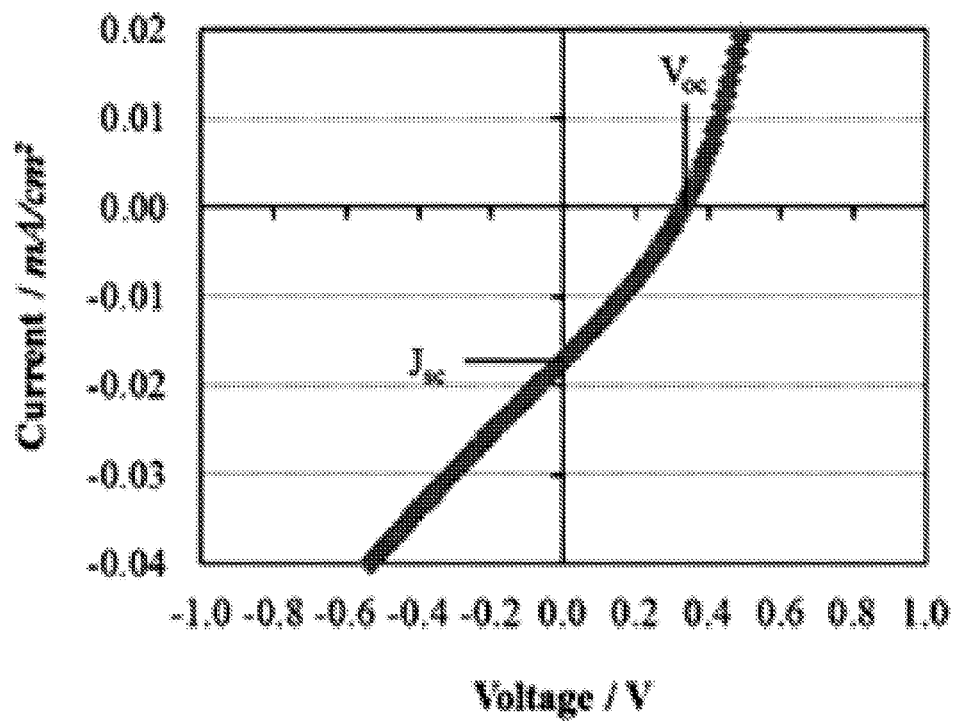
FIG. 7 is a current-voltage plot of an exemplary energy harvesting device as disclosed herein.

FIG. 7 depicts the current-voltage (I-V) characteristics for the exemplary P3HT/ZnO device prepared by the method disclosed herein. From this characteristic I-V curve the short circuit current (Jsc) and open circuit voltage (Voc) can be determined and utilized to calculate the fill factor (FF) and overall efficiency ($\eta$) of the device. From the experimental data depicted in FIG. 7, the maximum Voc, FF and $\eta$ for examples prepared by the present method were found to be 0.45 V, 43% and 0.002%, respectively. The Voc and FF are comparable with reported measurements for P3HT/ZnO devices prepared by previously reported methods. The observed extractable current of the presently disclosed devices are low, however, modification of the process and the material prepared therefrom provided increases in device efficiency of as much as two orders of magnitude, and suggests that these exemplary devices have formed a bi-layer structure, in which exciton dissociation likely occurs predominantly at the thin P3HT/ZnO interface. These results demonstrate that minimizing the bilayer structure and maximizing the inorganic material penetration within the organic fiber network will increase device efficiency Thus, the presently disclosed method demonstrates that functional energy harvesting devices can be generated using a solution-coated fibrillar, percolated P3HT network as the organic phase having ZnO deposited on or directly on the percolated network. For example, when a P3HT/ZnO composite film is sandwiched between two conductive electrodes a functional photovoltaic device is formed.

Figure 8:
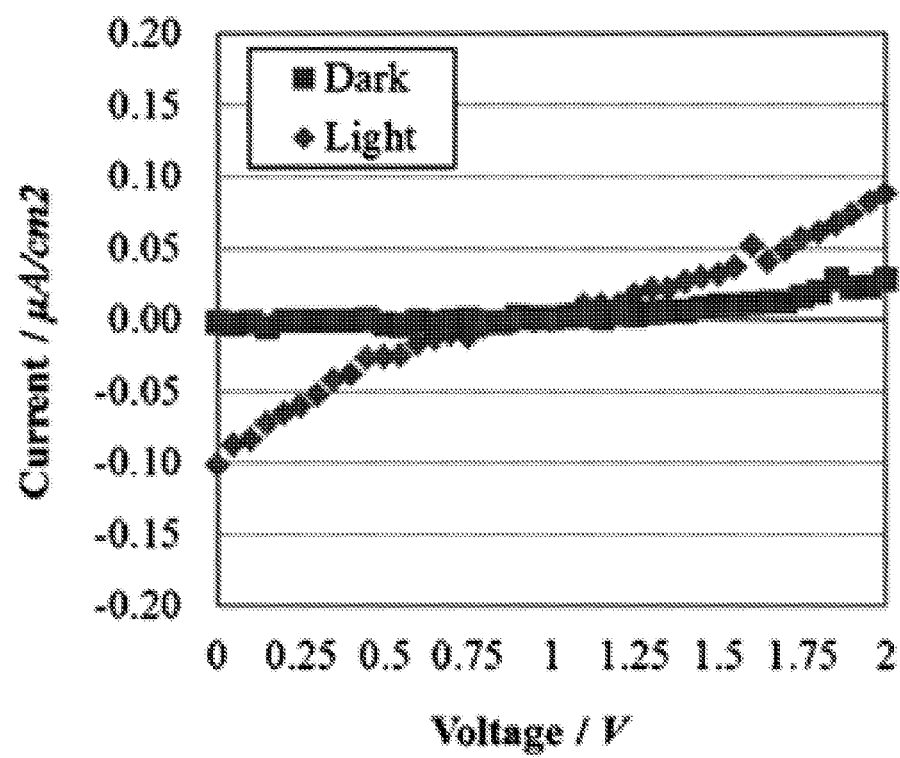
FIG. 8 is a current-voltage plot of an exemplary energy harvesting device as disclosed herein.

Typically, a large band mismatch is not desirable for photovoltaic devices because it creates energetic barriers for separating charges. Not surprisingly, therefore, the device performance for the P3HT/$SrTiO_3$ sample prepared by the methods disclosed above was less than P3HT/ZnO devices prepared as described above. FIG. 8 depicts the dark and light current-voltage response for the P3HT/$SrTiO_3$ photovoltaic device prepared by the present method under "1 sun" conditions. Surprisingly however, the open circuit voltage (Voc) for P3HT/$SrTiO_3$ is extremely high for the P3HT/ZnO-based device, being observed at 1.1 V, which is significantly higher than reported optimized literature values. This data demonstrates that utilizing thin, mismatched energetic layers provides a surprising increase of the Voc of hybrid photovoltaic devices.

Batch/Semi-Batch/Continuous Processing

The instantly described process may be configured and design to operate as a batch process, for example, organogel films can be fabricated separately, followed by a subsequent inorganic material coating process.

Alternatively, the instantly described apparatus and/or process may be continuous, the method including a step of continuously casting and/or coating a substrate with the organic polymer organogel films and depositing the inorganic material.

From the foregoing description, various modifications and changes in the compositions and method will occur to those skilled in the art without varying from the scope of the invention as defined in the following claims.

What is claimed:

1. A hybrid organic-inorganic thin film comprising:
an organic-phase comprising a porous organic nanostructure comprised of an interpenetrating network of one or more conjugated polymer fibers, the network having a plurality of voids of dimension between 0.1 and 100 nm, wherein the one or more conjugated polymer fibers comprises branching and/or roping; and
an amorphous inorganic phase at least partially distributed within the plurality of voids of the organic phase.

2. A hybrid organic-inorganic thin film of claim 1, wherein the organic phase has a first band gap and the inorganic phase has a second band gap different from the first band gap.

3. A hybrid organic-inorganic thin film of claim 1, wherein the organic layer is an organogel of one or more conjugated polymer fibers.

4. A hybrid organic-inorganic thin film of claim 1, wherein the inorganic phase comprises one or more semiconducting inorganic materials.

5. A hybrid organic-inorganic thin film of claim 4, wherein the one or more semiconducting inorganic materials are dispersed or distributed within the plurality of voids of the interpenetrating network.

6. A hybrid organic-inorganic thin film of claim 1, wherein the interpenetrating network is poly (3-hexylthiophene-2,5-diyl); poly(3-octylthiophene-2,5-diyl); poly(3-dodecylthiophene-2,5-diyl); or poly(9,9-dioctyl fluorene).

7. A hybrid organic-inorganic thin film of claim 1, wherein the interpenetrating network is poly (3-hexylthiophene-2,5-diyl); poly(3-octylthiophene-2,5-diyl); poly(3-dodecylthiophene-2,5-diyl); or poly(9,9-dioctyl fluorene) and the inorganic phase is $TiO_2$, ZnO, $Fe_2O_3$, $WO_3$, $SnO_2$, $Al_2O_3$, $V_2O_3$, $MoO_3$, NiO, $SrTiO_3$, $Cs(CO_3)$, AlN, or BN.

8. A hybrid organic-inorganic thin film of claim 1, wherein the interpenetrating network is poly (3-hexylthiophene-2,5-diyl) fibers and the inorganic phase is plasma deposited $TiO_2$ or $SrTiO_3$.

9. A hybrid organic-inorganic energy harvesting device comprising:
a first electrode;
an organic layer deposited on the first electrode, the organic layer comprising a porous interpenetrating network of one or more conjugated polymer fibers defining a plurality of voids of dimension between 0.1 and 100 nm to the substrate; and
an amorphous inorganic semiconducting material at least partially distributed within the interpenetrating network of fibers; and
a second electrode, wherein the organic layer and the inorganic semiconducting material are sandwiched between the first and the second electrodes.

10. A hybrid organic-inorganic energy harvesting device of claim 9, wherein the organic layer is an organogel of the one or more conjugated polymer fibers.

11. A hybrid organic-inorganic energy harvesting device of claim 9, wherein the organic layer is an organogel of one or more conjugated polymer fibers having a first band gap and the inorganic semiconducting material has a second band gap different from the first band gap.

12. A hybrid organic-inorganic energy harvesting device of claim 9, wherein the device is a solar cell.

13. A hybrid organic-inorganic energy harvesting device of claim 9, wherein the interpenetrating network is poly (3-hexylthiophene-2,5-diyl); poly(3-octylthiophene-2,5-diyl); poly(3-dodecylthiophene-2,5-diyl); or poly(9,9-dioctyl fluorene).

14. A hybrid organic-inorganic energy harvesting device of claim 9, wherein the interpenetrating network is poly (3-hexylthiophene-2,5-diyl); poly(3-octylthiophene-2,5-diyl); poly(3-dodecylthiophene-2,5-diyl); or poly(9,9-dioctyl fluorene) and the inorganic phase is $TiO_2$, ZnO, $Fe_2O_3$, $WO_3$, $SnO_2$, $Al_2O_3$, $V_2O_3$, $MoO_3$, NiO, $SrTiO_3$, $Cs(CO_3)$, AlN, or BN.

15. A hybrid organic-inorganic energy harvesting device of claim 9, wherein the interpenetrating network is poly (3-hexylthiophene-2,5-diyl) fibers and the inorganic semiconducting material is plasma deposited $TiO_2$ or $SrTiO_3$.

* * * * *

UNITED STATES PATENT AND TRADEMARK OFFICE
CERTIFICATE OF CORRECTION

PATENT NO. : 9,508,944 B2
APPLICATION NO. : 13/828708
DATED : November 29, 2016
INVENTOR(S) : Marvi A. Matos et al.

Page 1 of 1

It is certified that error appears in the above-identified patent and that said Letters Patent is hereby corrected as shown below:

On the Title Page

Please change Item "(73) Assignee" to:
THE BOEING COMPANY, Chicago, IL (US)
UNIVERSITY OF WASHINGTON CENTER FOR COMMERCIALIZATION, Seattle, WA (US)

Signed and Sealed this
Twenty-fifth Day of April, 2017

Michelle K. Lee
*Director of the United States Patent and Trademark Office*